(12) United States Patent
Joly et al.

(10) Patent No.: US 9,859,999 B2
(45) Date of Patent: Jan. 2, 2018

(54) SHIELDING ATTENUATION MEASUREMENT

(71) Applicant: Commissariat a L'Energie Atomique et aux Energies Alternatives, Paris (FR)

(72) Inventors: Jean-Christophe Joly, Gramat (FR); Sylvain Jonniau, Sainghin en Melantois (FR); Matthieu Werquin, Sainghin en Melantois (FR); Nicolas Vellas, Sainghin en Melantois (FR); Christophe Gaquiere, Sainghin en Melantois (FR); Benjamin Choteau, Sainghin en Melantois (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/292,640

(22) Filed: Oct. 13, 2016

(65) Prior Publication Data

US 2017/0111129 A1 Apr. 20, 2017

(30) Foreign Application Priority Data

Oct. 16, 2015 (FR) ...................................... 15 59888

(51) Int. Cl.
*H04B 17/00* (2015.01)
*H04B 17/318* (2015.01)

(52) U.S. Cl.
CPC ................................... *H04B 17/318* (2015.01)

(58) Field of Classification Search
None
See application file for complete search history.

(56) References Cited

U.S. PATENT DOCUMENTS

| 5,068,616 | A | * | 11/1991 | Broyde | ................ | H05K 9/0069 |
| | | | | | | 324/603 |
| 5,828,220 | A | * | 10/1998 | Carney | ................ | H05K 9/0069 |
| | | | | | | 174/350 |
| 6,255,830 | B1 | * | 7/2001 | Rollin | .................. | H05K 9/0069 |
| | | | | | | 174/387 |

(Continued)

OTHER PUBLICATIONS

French Preliminary Search Report dated Aug. 22, 2016 in French Application 15 59888 filed on Oct. 16, 2015 (with English Translation of Categories of Cited Documents).

(Continued)

*Primary Examiner* — Tuan A Tran
(74) *Attorney, Agent, or Firm* — Oblon, McClelland, Maier & Neustadt, L.L.P.

(57) ABSTRACT

A system for measuring the attenuation of electromagnetic shielding of an infrastructure as a function of the frequency, including a transmitter of a white noise signal with a constant power over a frequency band between a minimum frequency and a maximum frequency, a signal receiver, the transmitter and the receiver being capable of sending a signal and receiving a signal across the infrastructure, the receiver including a filter module capable of applying sliding filter on the received signal between the minimum frequency and the maximum frequency, and a double synchronous detection module capable of double synchronous detection on a signal output by the filter module.

9 Claims, 3 Drawing Sheets

(56) References Cited

U.S. PATENT DOCUMENTS 7,675,294 B2 * 3/2010 Stone, III ............... G01N 22/00
324/627

OTHER PUBLICATIONS

PerkinElmer, "What is a Lock-in Amplifier?", Technical Note Perkinelmer, XP-002416964, 2000, 4 pgs.
Michael O. Hatfield, "Shielding Effectiveness Measurements Using Mode-Stirred Chambers: A Comparison of Two Approaches", IEEE Transactions on Electromagnetic Compatibility, XP-002759949, vol. 30, (3), 1988. 10 pgs.

* cited by examiner

SHIELDING ATTENUATION MEASUREMENT

TECHNICAL FIELD

This invention relates to the measurement of the attenuation of electromagnetic shielding of an infrastructure as a function of the frequency.

STATE OF PRIOR ART

Conventionally, the attenuation of electromagnetic shielding of an infrastructure, also called the shielding efficiency or faradisation, is measured using the principle of double weighing. This is done using a measurement device comprising a signal transmitter and a signal receiver, that is used as follows.

A first reference or calibration measurement is made with the transmitter and the receiver positioned at a predetermined distance in the absence of an infrastructure. The transmitter transmits a signal with a known transmission power and this signal is received by the receiver.

A second measurement is made, firstly positioning the transmitter and the receiver on opposite sides of the infrastructure for which the shielding attenuation is to be determined. The transmitter and the receiver are positioned at the same distance and at the same orientation and the signal is transmitted with the same transmission power as for the first measurement. The receiver receives this signal.

The shielding attenuation is the ratio between the first and the second received powers.

The attenuation measurement is made as a function of the frequency, typically from the order of 1 kHz to about 10 GHz. Therefore the shielding attenuation is given as a function of the frequency: for example, a power factor 5 (namely $10 \log_{10} 5 = 7$ dB) at 1 GHz. This implies that the transmission frequency and reception frequency are synchronised.

A first solution for synchronising the transmitter and the receiver is to make measurements at discrete frequencies. In this case, a measurement is only valid at a given frequency and the measurement steps have to be repeated for each frequency.

A second way of synchronising is to make a connection between the transmitter and the receiver. This liaison can be set up using a wire conductor or an optic fibre, but this requires the presence of a passageway through the infrastructure, for example such as an opening, a honeycomb structure or a wave guide. Furthermore, passing a wire conductor without repairing the shielding would distort the measurement because the wire conductor would be perceived as a faradisation defect.

The connection between the transmitter and the receiver can also be made by radio waves, possibly in the measurement band. This is only possible if the infrastructure shielding attenuation is relatively limited, such that the radio wave can transit through the infrastructure.

Furthermore, the electromagnetic environment of the infrastructure to be characterised is likely to be noisy. GSM, wifi or radar waves, for example, can form ambient electromagnetic pollution. This electromagnetic pollution could be interpreted as being a faradisation defect of the infrastructure. Thus, the measured shielding attenuation would be wrong at the frequencies of the electromagnetic pollution.

Electromagnetic pollution can be taken into account with known measuring instruments by making an ambient background noise measurement before starting the calibration. A noise power is thus determined. It is subtracted from power measurements made afterwards during the attenuation calibration.

However, this calculation assumes that electromagnetic pollution remains constant in time. The calculated attenuation will then be distorted if the electromagnetic pollution is intermittent and if it varies between or during measurements.

PRESENTATION OF THE INVENTION

The invention aims to solve problems with prior art by providing a system for measuring the attenuation of electromagnetic shielding of an infrastructure as a function of the frequency, characterised in that it comprises:

A signal transmitter that is a white noise with a constant power over a frequency band between a minimum frequency and a maximum frequency, A signal receiver, the transmitter and the receiver being capable of sending a signal and receiving a signal across the infrastructure, the receiver comprising:

A filter module capable of applying a sliding filter on the received signal (SR) between the minimum frequency and the maximum frequency, and A double synchronous detection module capable of double synchronous detection on a signal output by the filter module.

With the invention, the shielding attenuation measurement is made more easily and quickly then with prior art.

In particular, the measurement is made for a frequency chosen in a frequency range, without it being necessary to repeat signal transmission and reception operations.

According to one preferred characteristic:

The transmitter is capable of transmitting a signal that is chopped white noise comprising two alternating power levels, and The receiver is capable of determining the difference between received powers corresponding to two power levels of the transmitted signal.

Thus, the contribution of ambient noise can be cancelled. The shielding attenuation measurement according to this invention is independent of the electromagnetic environment.

According to one preferred characteristic, the receiver also comprises a module for determination of the shielding attenuation as a function of the results obtained by the double synchronous detection module determined following signal transmission and reception in the absence of the infrastructure and then on each side of the infrastructure.

This invention also relates to a receiver for a system for measurement of the attenuation of electromagnetic shielding of an infrastructure as a function of the frequency, characterised it that it is capable of receiving a signal transmitted by a transmitter of a white noise signal with constant power over a frequency band between a minimum frequency and a maximum frequency, the transmitter and the receiver being capable of transmitting and receiving a signal on opposite sides of the infrastructure, and characterised in that it comprises A filter module capable of applying a sliding filter on the received signal between the minimum frequency and the maximum frequency, and A double synchronous detection module capable of double synchronous detection on a signal output by the filter module.

According to one preferred characteristic, the receiver also comprises a module for determination of the shielding attenuation as a function of the results obtained by the double synchronous detection module determined following signal transmission and reception in the absence of the infrastructure and then on each side of the infrastructure.

The invention also relates to a method for measuring the attenuation of electromagnetic shielding of an infrastructure as a function of the frequency, characterised in that it comprises the following steps:

Transmission of a white noise signal with a constant power over a frequency band between a minimum frequency and a maximum frequency, Reception of a signal, the signal transmission and reception taking place on opposite sides of the infrastructure, Application of a sliding filter on the received signal between the minimum frequency and the maximum frequency, Synchronous double detection on a signal output by the filter module.

According to one preferred characteristic, the method for measuring the attenuation of electromagnetic shielding of an infrastructure also comprises preliminary steps for the transmission and reception of a signal in the absence of the infrastructure, applying a sliding filter on the received signal and double synchronous detection on a signal output by the filter module.

According to one preferred characteristic, the method for measuring the attenuation of electromagnetic shielding of an infrastructure also comprises a step to determine the shielding attenuation as a function of the results obtained by the sliding filter and double synchronous detection steps made following signal transmission and reception in the absence of the infrastructure and then on each side of the infrastructure.

The receiver and the method have advantages similar to those mentioned above.

In one particular embodiment, the sliding filter and double synchronous detection steps in the method according to the invention are implemented by the instructions in a computer program.

Consequently, the invention also relates to a computer program stored on a data medium, this program possibly being installed on a computer, this program including instructions adapted to implementation of the sliding filter and double synchronous detection steps in a method like that described above.

This program can use any programming language and may be in the form of source code, object code or a code intermediate between source code and object code, such as a partially compiled form, or in any other desirable form.

The invention also relates to a data medium that can be read by a computer, containing computer program instructions adapted to implementation of the steps in a method like that described above.

The data medium may be any entity or device on which the program can be stored. For example, the medium may include a storage means such as a ROM, for example a CD ROM or a microelectronic circuit ROM, or a magnetic recording device such as for example a diskette or a hard disk.

The data medium may also be a transmissible medium such as an electrical or optical signal that can be routed on an electrical or optical cable, by radio or by other means. In particular, the program according to the invention can be downloaded on an Internet type network.

Alternately, the data medium can be an integrated circuit in which the program is included, the circuit being adapted to run or to be used for running the method according to the invention.

BRIEF DESCRIPTION OF THE DRAWINGS

Other characteristics and advantages will become clear after reading the following description of a preferred embodiment given as a non-limitative example, described with reference to the figures in which.

DETAILED PRESENTATION OF PARTICULAR EMBODIMENTS

Figure 1:
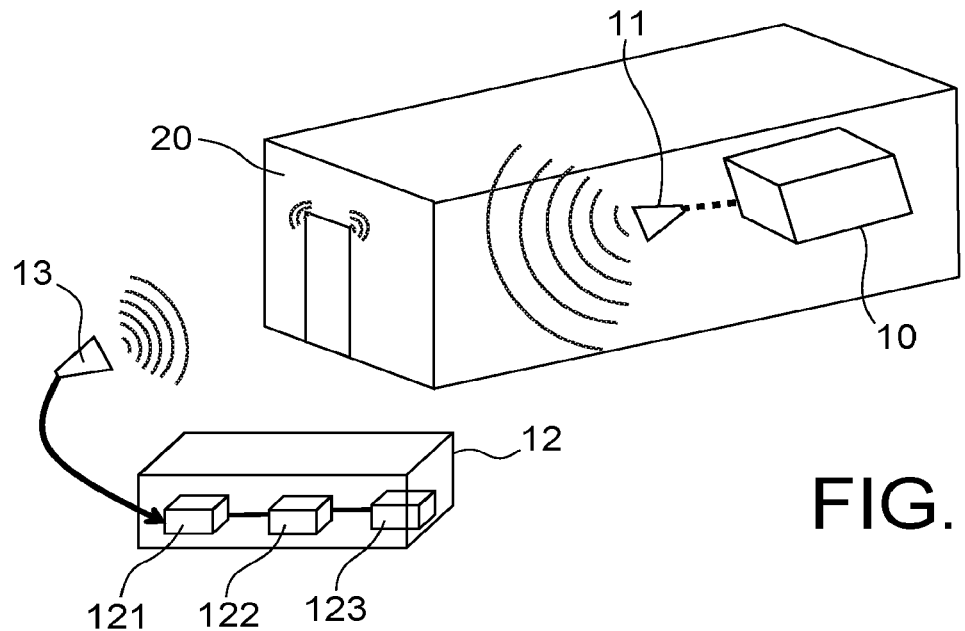
FIG. 1 represents a system for measuring the shielding attenuation according to one embodiment of this invention.

According to one preferred embodiment shown on FIG. 1, a system for measuring the shielding attenuation comprises a signal transmitter 10 connected to a transmission antenna 11. The transmitter 10 is capable of transmitting a signal that is described below.

The shielding attenuation measurement system also comprises a receiver 12 connected to a reception antenna 13.

The transmission and reception antennas may be of any type, for example:
Directional or omnidirectional,
Wide band or narrow band,
Linear or circular polarisation,
Electronic or mechanical directional control,
Wire, aperture or planar, with progressive or stationary waves.

The receiver 12 is capable of receiving a signal received by the reception antenna 13. The receiver 12 comprises a filter module 121, a double synchronous detection module 122 and a measurement processing module 123 to determine the attenuation of a shielding. Processing done by the different modules is described below.

The shielding attenuation measurement system may be battery powered.

Note that the description only includes elements of the shielding attenuation measurement system that are useful for understanding the invention.

The shielding attenuation measurement system is used according to the double weighing principle. A first measurement, called the reference measurement, is made when the transmission antenna 11 and the reception antenna 13 are put into place in the absence of a structure for which the shielding attenuation is to be determined, at a determined distance and orientation. The transmission antenna and the reception antenna are then placed on each side of the structure for which the shielding attenuation is to be determined, at the same determined distance and orientation. A second measurement is made.

The signals transmitted for the two measurements have the same power.

The shielding attenuation is the ratio of the powers received during the two measurement operations. The attenuation measurement is made as a function of the frequency, typically of the order of 1 kHz to about 10 GHz.

FIG. 1 illustrates the configuration for making the second measurement in the case in which the structure is a wall 20 of a room in a building. The wall 20 comprises a door 21, the corners of which form potential shielding defects. The antennas 11 and 13 are thus located on each side of the wall 20.

Figure 2:
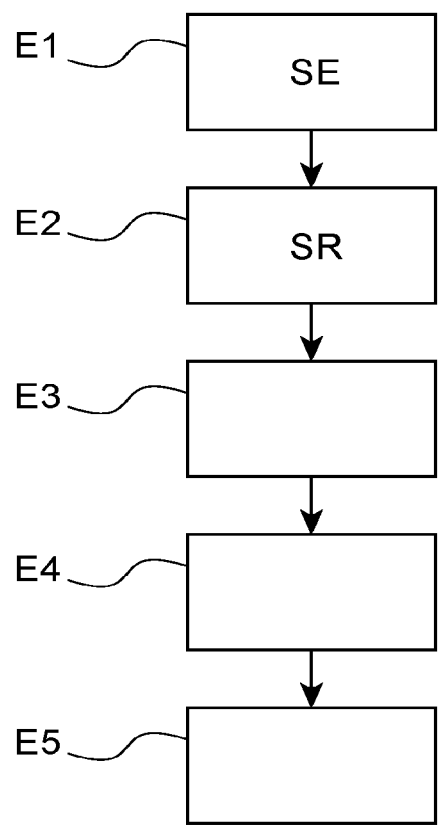
FIG. 2 represents a method for measuring the shielding attenuation according to one embodiment of this invention.

FIG. 2 represents the operation of the system for measuring the shielding attenuation according to one embodiment of the invention. This operation is represented in the form of a flowchart comprising steps E1 to E5.

Step E1 is the transmission of a signal SE by the transmitter 10.

Figure 3:
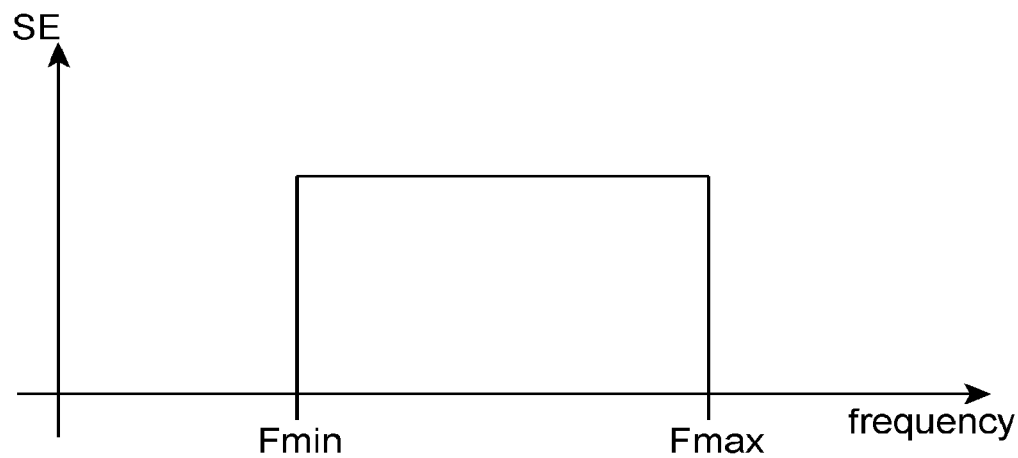
FIG. 3 represents a signal transmitted by the system for measuring the shielding attenuation according to one embodiment of this invention.

FIG. 3 represents the signal SE transmitted by the transmitter 10 as a function of the frequency. The transmitted signal SE is a white noise signal with a constant power over a frequency band between a minimum frequency $F_{min}$ and a maximum frequency $F_{max}$.

The next step E2 is the reception of a signal SR by the receiver 12.

The next step E3 is a sliding filter applied to the received signal SR.

Figure 4:
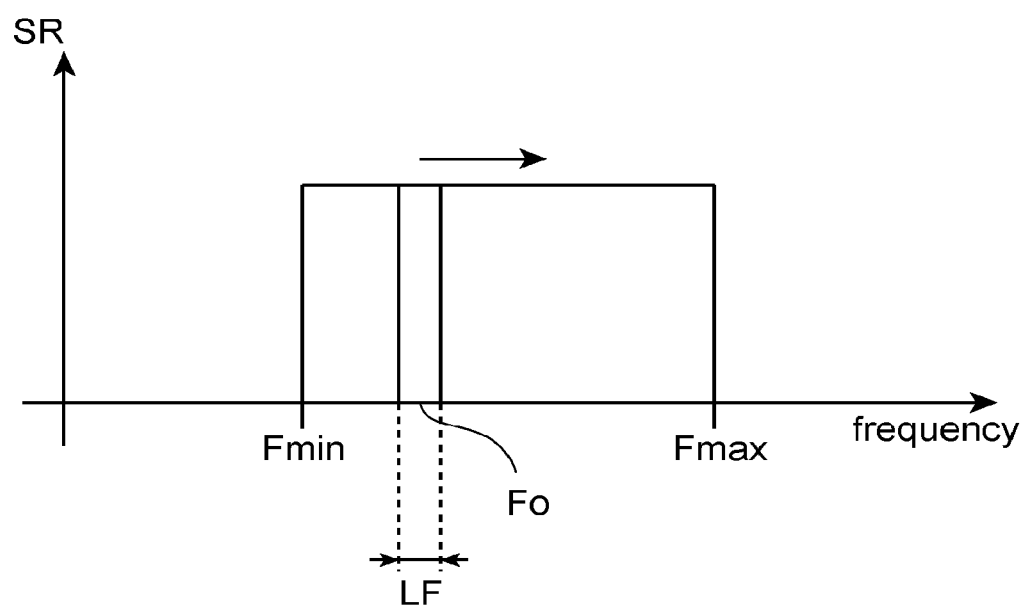
FIG. 4 represents a sliding filter performed on a signal received by the system for measuring the shielding attenuation according to one embodiment of this invention.

FIG. 4 represents the sliding filter applied to the signal SR received by the receiver 12. The signal SR is within the frequency band between frequencies $F_{min}$ and $F_{max}$.

A sliding filter is applied between frequencies $F_{min}$ and $F_{max}$. The sliding filter has a predetermined width LF around a frequency $F_0$ that varies from $F_{min}$ to $F_{max}$.

The next step E4 is determination of the received power at a given frequency within the frequency band of the transmitted signal SE. The received power is expressed in Watts. It is memorised in a memory (not shown) internal to the receiver or associated with the receiver.

As described above, a reference measurement is made when the transmission antenna and the reception antenna are put into place in the absence of the structure for which the shielding attenuation is to be determined, at a determined distance and orientation. Therefore steps E1 to E4 are performed for this first measurement. The memorised power is then a received reference power $PR_{ref}$. It should be noted that this power depends on the distance between the transmission antenna and the reference antenna, the orientation of the antennas and the power of the transmitted signal. Therefore, provided that these parameters are respectively the same for several different shielding attenuation determinations, the same received reference power can be used later for these different shielding attenuation determinations.

The transmission antenna and the reception antenna are then placed on each side of the structure for which the shielding attenuation is to be determined, at the same determined distance and orientation. A second measurement is made from the same transmission signal SE. Therefore steps E1 to E4 are performed for this second measurement. The result of step E4 is then a received signal power PR for a given frequency within the frequency band of the transmitted signal SE.

Step E5 determines the shielding attenuation for one or more frequencies in the frequency band between the frequencies $F_{min}$ and $F_{max}$.

The shielding attenuation is determined for a given frequency F. It is equal to the ratio between the power of the reference signal $PR_{ref}$ and the power of the received signal PR during the second measurement, at the given frequency F. Note that the powers are expressed in Watts. Step E5 is described in detail below.

Any variations in the environmental noise between the two measurements are taken into account as follows.

Figure 5:
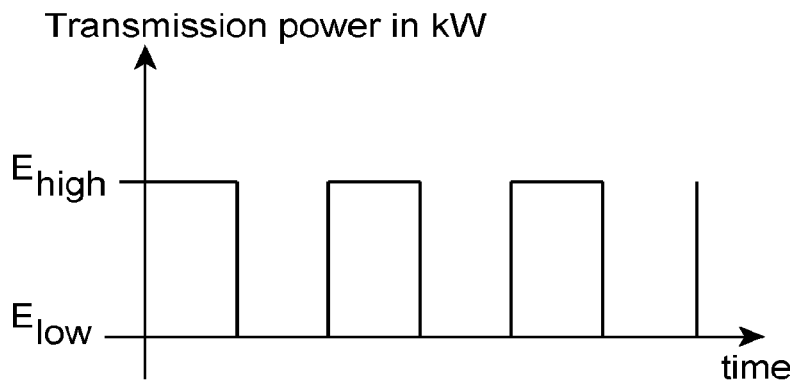
FIG. 5 represents a signal transmitted by the system for measuring the shielding attenuation according to one embodiment of this invention.

FIG. 5 represents the signal SE transmitted by the transmitter 10, as a function of time. The transmitted signal SE is a chopped white noise in the form of square wave with a cyclic ratio equal to ½. The cyclic ratio may be different.

The transmitted power is alternatively in a high state $E_{high}$ corresponding to a transmission time and a low state $E_{low}$ in which the transmitted power is null, corresponding to the transmission being cut off.

Figure 6A:
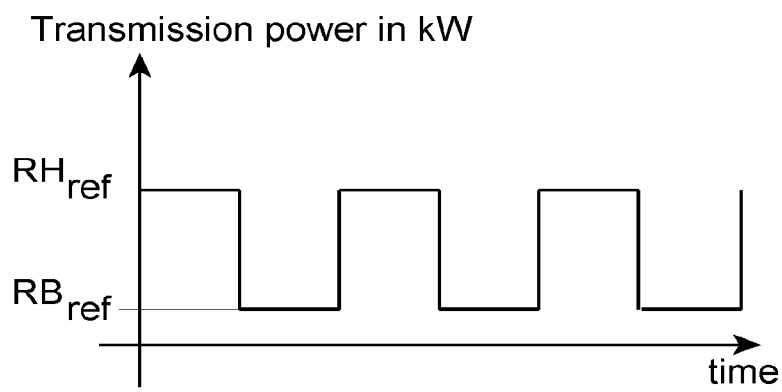
FIGS. 6a and 6b represent signals received by the system for measuring the shielding attenuation, according to one embodiment of this invention.
Figure 6B:
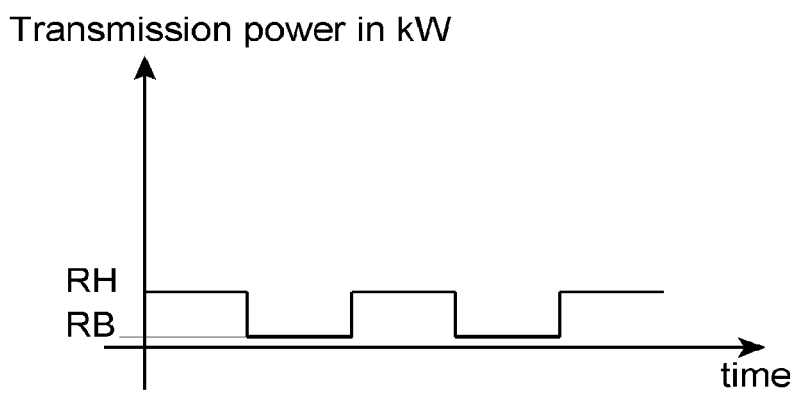

FIGS. 6a and 6b represent the signal SR received by the receiver 12 as a function of time, during the reference measurement and during the second measurement respectively.

In both cases, for the reference measurement and the second measurement, the received signal SR is also chopped in the form of square wave with a cyclic ratio equal to ½. The received power is alternatively in a high state corresponding to a transmission time and a low state in which the received power is low but not null, corresponding to the transmission being cut off. The power received in the low state corresponds to environmental noise and the power received in the high state corresponds to the sum of white noise received from the transmitter and environmental noise.

After the reference measurement, the difference between the power received in the high state $RH_{ref}$ and the power received in the low state $RB_{ref}$ is calculated, to cancel the contribution of ambient noise.

Similarly, after the second measurement, the difference between the power received in the high state RH and the power received in the low state RB is calculated, once again to cancel the contribution of ambient noise.

The module 122 uses double synchronous detection to measure the difference in power received between successive phases with and without transmission, without knowing the instant of the phase change controlled by the transmitter 10. This avoids the influence of a possible phase shift $\Delta \varphi$ between the received signal SR at the modulation frequency Fm and a demodulation signal.

The processing done on the signal $V_{in}$ output from the sliding filter 121 is considered. The signal $V_{in}$ is applied to the input of the double synchronous detection module 122. The quantity $\Delta V_{in}$ is representative of the difference in received powers (RH−RB) corresponding to the emission of white noise with cyclic ratio ½.

Compared with classical synchronous detection, the module 122 makes a first demodulation at the modulation frequency Fm and a second demodulation at frequency (Fm+π/2). The quantities: $0.5 \cdot \Delta V_{in} \cdot \cos(\Delta \varphi)$ and $0.5 \cdot \Delta V_{in} \cdot \cos(\Delta \varphi + \pi/2) = 0.5 \cdot \Delta V_{in} \cdot \sin(\Delta \varphi)$ are thus determined. These quantities are then squared and summated. The module 122 then outputs the quantity $(0.5 \cdot \Delta V_{in})^2 \cdot (\cos^2(\Delta \varphi) + \sin^2(\Delta \varphi))$. This quantity is equal to $(0.5 \cdot \Delta V_{in})^2$.

Thus, the output signal obtained is $(0.5 \cdot \Delta V_{in})^2$. The output signal is independent of a possible phase shift between the modulation signal used for transmission and the demodulation signal used for reception.

This quantity is an image of $\Delta V_{in}$ in which $\Delta V_{in}$ is representative of the difference in received powers (RH−RB) corresponding to the emission of white noise with cyclic ratio ½ at the modulation frequency Fm.

The shielding attenuation is determined for a given frequency F, by the module 123. It is equal to the ratio of the difference calculated for the reference measurement and the difference calculated for the second measurement: $(RH_{ref} - RB_{ref})/(RH-RB)$. Note again that all powers are expressed herein in Watts.

Processing done on the signal received by the receiver 12 can be repeated for all frequencies within the frequency band varying from $F_{min}$ to $F_{max}$.

The range of the measurement system is increased by the use of an automatic gain control so as to work at constant power at the input to the detection diode.

The invention claimed is:

1. A system for measuring the attenuation of electromagnetic shielding of an infrastructure as a function of the frequency, comprising:
   a transmitter of a white noise signal with a constant power over a frequency band between a minimum frequency and a maximum frequency; and
   a receiver of the white noise signal, the transmitter and the receiver being capable of sending a signal and receiving a signal across the infrastructure, the receiver comprising:
      a filter module configured to apply a sliding filter on the received white noise signal between the minimum frequency and the maximum frequency, and
      a double synchronous detection module configured to double synchronous detect on a signal output by the filter module.

2. The system for measuring the attenuation of electromagnetic shielding of an infrastructure according to claim 1, wherein:
   the transmitter is configured to transmit a signal that is chopped white noise comprising two alternating power levels,
   the receiver is configured to determine the difference between received powers corresponding to two power levels of the transmitted signal.

3. The system for measuring the attenuation of electromagnetic shielding of an infrastructure according to claim 1, wherein the receiver comprises a determination module configured to determine the shielding attenuation as a function of the results output by the double synchronous detection module determined following signal transmission and reception in the absence of the infrastructure and then on each side of the infrastructure.

4. A receiver for a system for measurement of the attenuation of electromagnetic shielding of an infrastructure as a function of the frequency, comprising:
   circuitry configured to receive a white noise signal transmitted by a transmitter of the white noise signal with constant power over a frequency band between a minimum frequency and a maximum frequency, the transmitter and the receiver being configured to transmit and receive a signal on opposite sides of the infrastructure;
   a filter module configured to apply a sliding filter on the received white noise signal between the minimum frequency and the maximum frequency; and
   a double synchronous detection module configured to double synchronous detect on a signal output by the filter module.

5. The receiver according to claim 4, comprising a determination module configured to determine the shielding attenuation as a function of the results output by the double synchronous detection module determined following signal transmission and reception in the absence of the infrastructure and then on each side of the infrastructure.

6. A method for measuring the attenuation of electromagnetic shielding of an infrastructure as a function of the frequency, comprising the following steps:
   transmitting a white noise signal with a constant power over a frequency band between a minimum frequency and a maximum frequency;
   receiving the white noise signal, the signal transmission and reception taking place on opposite sides of the infrastructure;
   performing sliding filtering on the received signal between the minimum frequency and the maximum frequency; and
   performing synchronous double detection on a signal output by the filtering.

7. The method for measuring the attenuation of electromagnetic shielding of an infrastructure according to claim 6, further comprising
   preliminary steps of the transmitting and receiving of a signal in the absence of the infrastructure, and applying the sliding filter on the received signal and double synchronous detection on a signal output by the sliding filter step.

8. The method for measuring the attenuation of electromagnetic shielding of an infrastructure according to claim 7, further comprising a step of determining the shielding attenuation as a function of the results of the sliding filter and double synchronous detection steps performed following signal transmission and reception in the absence of the infrastructure and then on each side of the infrastructure.

9. A non-transitory storage medium that can be read by a computer, in which a computer program is stored containing instructions for execution of controlling the transmitting of the white noise signal, controlling the receiving of the white noise signal, the sliding filter, and the double synchronous detection steps in the method according to claim 6.

* * * * *